United States Patent
Wu et al.

(10) Patent No.: US 11,935,823 B2
(45) Date of Patent: Mar. 19, 2024

(54) DISPLAY DEVICE AND FABRICATION METHOD OF THE SAME HAVING A BOOTS LAYER

(71) Applicant: E Ink Holdings Inc., Hsinchu (TW)

(72) Inventors: Yi-Jiun Wu, Hsinchu (TW); Wei-Shih Ni, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 112 days.

(21) Appl. No.: 17/450,287

(22) Filed: Oct. 8, 2021

(65) Prior Publication Data
US 2022/0328393 A1    Oct. 13, 2022

(30) Foreign Application Priority Data
Apr. 7, 2021   (TW) .................................. 110112485

(51) Int. Cl.
*H01L 23/498*   (2006.01)
*H01L 23/00*    (2006.01)
*H01L 23/50*    (2006.01)

(52) U.S. Cl.
CPC ........ *H01L 23/49838* (2013.01); *H01L 23/50* (2013.01); *H01L 24/03* (2013.01)

(58) Field of Classification Search
CPC ... H01L 23/49838; H01L 23/50; H01L 24/03; H01L 24/81; H01L 24/16; H01L 2224/81201; H01L 2224/81385; H01L 2224/81486; G02F 1/13458; G09F 9/33
USPC ........................................................ 257/784
See application file for complete search history.

(56) References Cited

U.S. PATENT DOCUMENTS

| | | | |
|---|---|---|---|
| 7,371,606 B2 | 5/2008 | Ujiie et al. | |
| 8,304,907 B2 | 11/2012 | Lin et al. | |
| 9,366,927 B2 | 6/2016 | Jung | |
| 9,837,007 B2 | 12/2017 | Kang et al. | |
| 10,431,617 B2 | 10/2019 | Kawano et al. | |
| 2004/0256620 A1* | 12/2004 | Yamazaki | H10K 10/466 257/66 |
| 2014/0175442 A1* | 6/2014 | Kwack | H01L 27/124 438/151 |
| 2015/0303123 A1* | 10/2015 | Choi | H01L 29/78618 438/158 |
| 2016/0197097 A1* | 7/2016 | Kim | H10K 59/1275 257/40 |
| 2017/0250199 A1* | 8/2017 | Odaka | H10K 50/813 |
| 2018/0350889 A1* | 12/2018 | Son | H01L 27/1225 |
| 2020/0168695 A1* | 5/2020 | Moon | H01L 27/1244 |

FOREIGN PATENT DOCUMENTS

| | | |
|---|---|---|
| KR | 20120013684 A | 2/2012 |
| TW | 201809190 A | 3/2018 |

* cited by examiner

*Primary Examiner* — Nduka E Ojeh
*Assistant Examiner* — Laura M Dykes
(74) *Attorney, Agent, or Firm* — CKC & Partners Co., LLC (57) ABSTRACT

A display device includes a metal layer, a boots layer, a passivation layer, and a conductive layer. The boots layer is located below the metal layer. The boots layer is partially overlapped with the metal layer. The passivation layer covers the metal layer and the boots layer. The conductive layer covers the passivation layer and the metal layer. The conductive layer is overlapped with the boots layer along a direction of the orthogonal projection.

9 Claims, 9 Drawing Sheets

DISPLAY DEVICE AND FABRICATION METHOD OF THE SAME HAVING A BOOTS LAYER

CROSS-REFERENCE TO RELATED APPLICATION

This application claims priority to Taiwan Application Serial Number 110112485, filed Apr. 7, 2021, which is herein incorporated by reference in its entirety.

BACKGROUND

Field of Invention

The present disclosure relates to a display device and fabrication method of the same.

Description of Related Art

The current product has fine-pitch design, and a precision deviation of a machine for positioning chips is about 5 um. Therefore, a situation that the distance D between the conductive layer and the passivation layer is smaller than the deviation of the machine may occur. As such, the electronic element and the passivation layer squeeze each other in the compression process due to the positioning deviation, and therefore the passivation may break and cause a short.

In view of this, how to provide a display device that can prevent the passivation layer from being broken due to the squeeze between the electronic element and the passivation layer in the compression and bonding processes is still one of objectives to be studied urgently in industry at present.

SUMMARY

One aspect of the present disclosure is a display device.

In an embodiment of the present disclosure, a display device includes a metal layer, a boots layer, a passivation layer, and a conductive layer. The boots layer is located below the metal layer. The boots layer is partially overlapped with the metal layer. The passivation layer covers the metal layer and the boots layer. The conductive layer covers the passivation layer and the metal layer. The conductive layer is overlapped with the boots layer along a direction of the orthogonal projection.

In an embodiment of the present disclosure, the metal layer includes a bonding pad and a circuit, and the boots layer is overlapped with the bonding pad.

In an embodiment of the present disclosure, the passivation layer includes a first portion located on the circuit, the conductive layer and the first portion of the passivation layer have a distance therebetween, and the distance is smaller than or equals to 5 um.

In an embodiment of the present disclosure, the boots layer includes a plurality of sections, and the sections are separated from each other.

In an embodiment of the present disclosure, the boots layer includes organic material.

In an embodiment of the present disclosure, a thickness of the boots layer is smaller than 3 um.

In an embodiment of the present disclosure, the passivation layer includes organic material.

In an embodiment of the present disclosure, the passivation layer includes organic material and inorganic material.

Another aspect of the present disclosure is a fabrication method of a display device.

In an embodiment of the present disclosure, the fabrication method of a display device includes forming a boots layer; forming a metal layer on the boots layer, and the boots layer is partially overlapped with the metal layer; forming a passivation layer on the metal layer, and the passivation layer covers the metal layer and the boots layer; and forming a conductive layer on the passivation layer, and the conductive layer covers the passivation layer and the metal layer, and the conductive layer and the boots layer are overlapped along a direction of an orthogonal projection.

In an embodiment of the present disclosure, forming the boots layer includes forming a plurality of sections, and the sections are separated from each other.

In an embodiment of the present disclosure, the metal layer includes a bonding pad and a circuit, and forming the metal layer includes overlapping the boots layer with the bonding pad.

In an embodiment of the present disclosure, the fabrication method further includes connecting an electronic connection element with the conductive layer, wherein the passivation layer includes a first portion located on the circuit, and the electronic connection element is separated from the first portion of the passivation layer.

In the foregoing embodiments, since the display device of the present disclosure has a boots layer below the metal layer, and therefore the distance between the top surface of the conductive layer and the passivation layer on the circuit of the metal layer is increased. Accordingly, the electronic element disposed on the bonding pad of the conductive layer and the passivation layer located on the circuit of the metal layer do not squeeze each other and being broken due to positioning deviation of the machine, thereby prevent the short.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
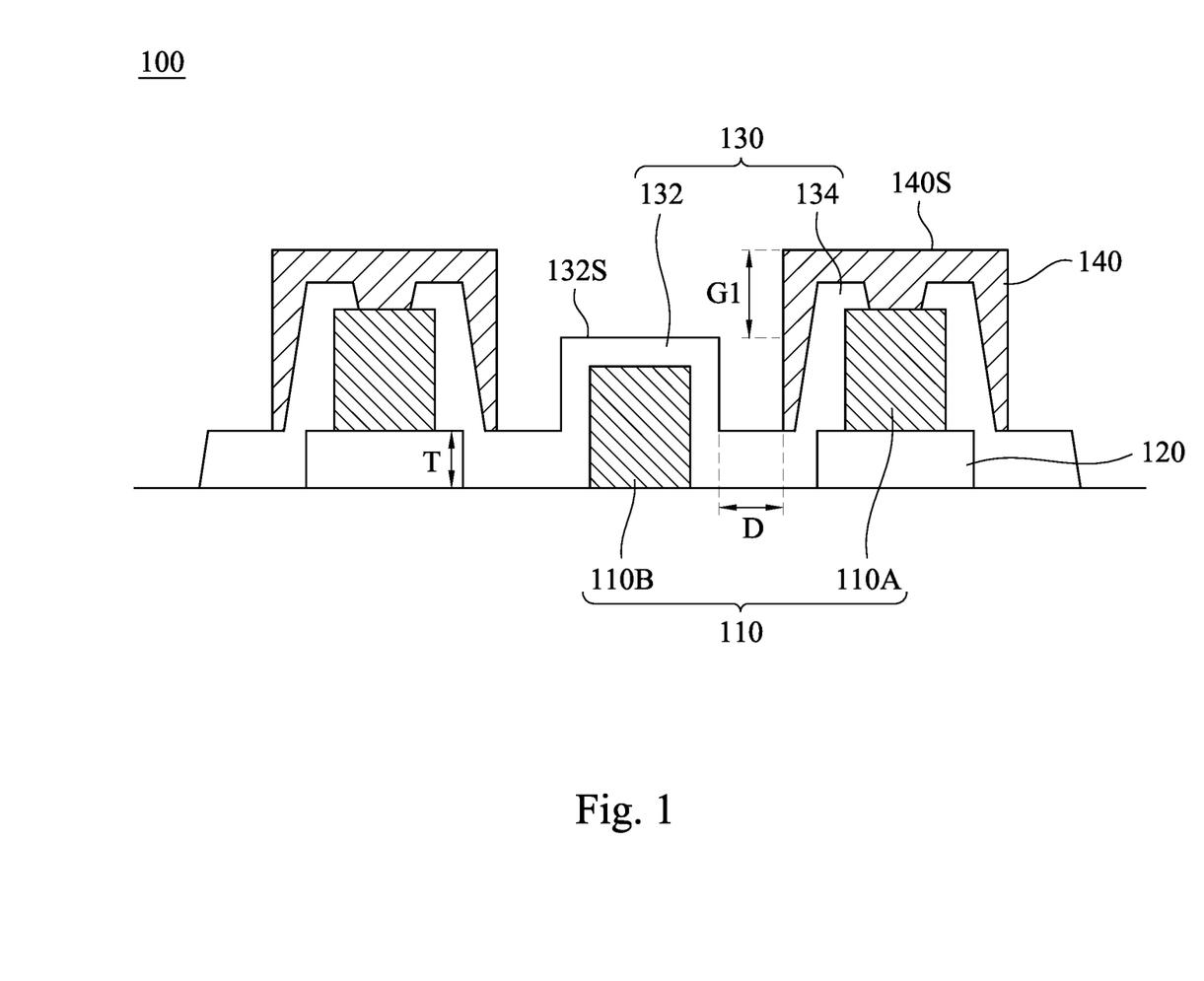
FIG. 1 is a cross-sectional view of a display device according to an embodiment of the present disclosure.
Figure 7:
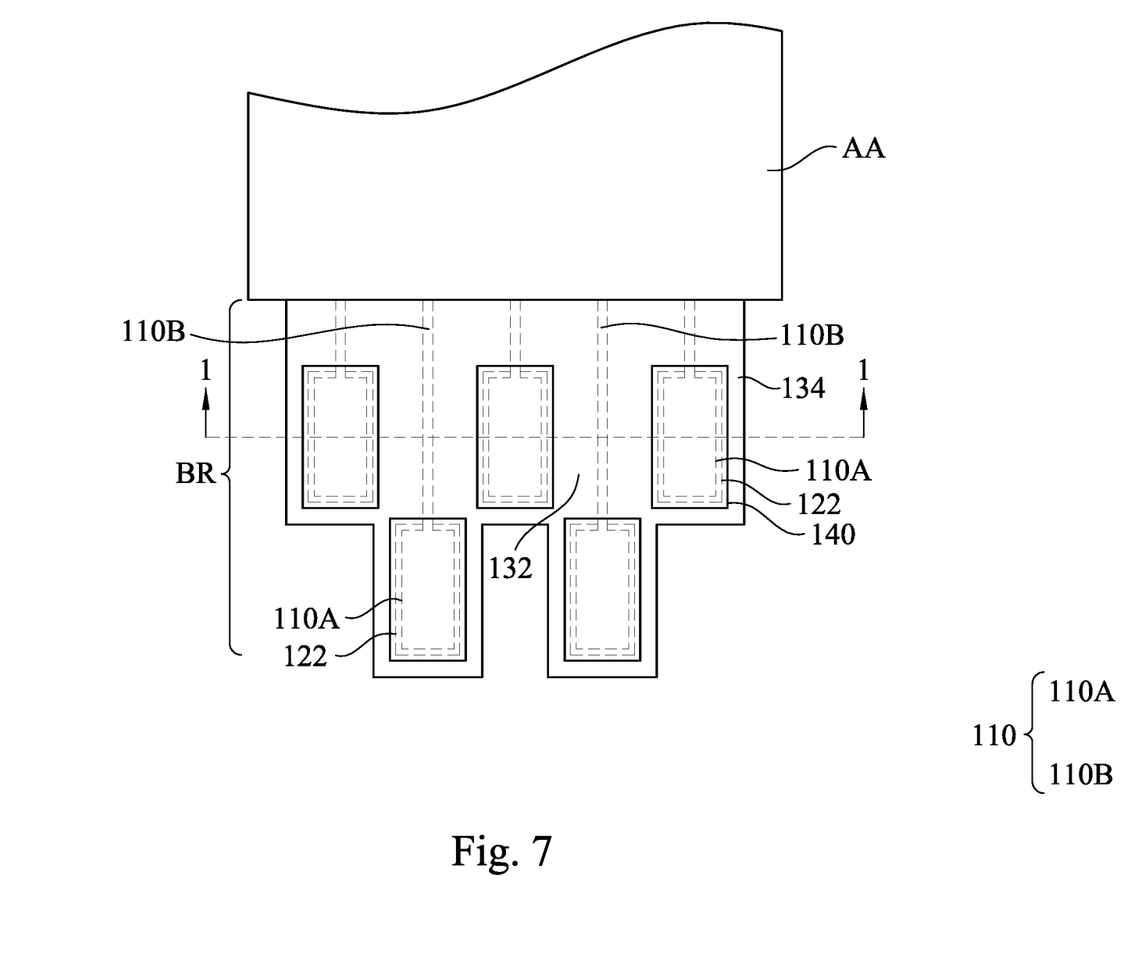
FIG. 7 is a top view of intermediate step of a fabrication method of a display device according to an embodiment of the present disclosure.

FIG. 1 is a cross-sectional view of a display device 100 according to an embodiment of the present disclosure. FIG. 7 is a top view of intermediate step of a fabrication method of a display device according to an embodiment of the present disclosure. FIG. 1 is a cross-sectional view taken along line 1-1 in FIG. 7. The display device 100 includes a metal layer 110, a boots layer 120, a passivation layer 130, and a conductive layer 140. The boots layer 120 is located below the metal layer 110, and the boots layer 120 is partially overlapped with the metal layer 110. The passivation layer 130 covers the metal layer 110 and the boots layer 120.

The metal layer 110 includes a bonding pad 110A and a circuit 110B, and the boots layer 120 is overlapped with the bonding pad 110A. The passivation layer 130 includes a first portion 132 located on the circuit 110B and a second portion 134 located on the bonding pad 110A. The conductive layer 140 covers the second portion 134 of the passivation layer 130 and the bonding pad 110A of the metal layer 110, and the conductive layer 140 is overlapped with the boots layer 120 along a direction of the orthogonal projection. The bonding pad 110A of the metal layer 110 is exposed from the passivation layer 130 so as to in contact with the conductive layer 140, and the conductive layer 140 is configured to prevent oxidization of the metal layer 110. The conductive layer 140 that covers the second portion 134 of the passivation layer 130 and the first portion of the passivation layer 130 have a distance D therebetween, and the distance D is smaller than or equal to 5 um.

The material of the metal layer 110 may include aluminum (Al), silver (Ag), copper (Cu). The material of the passivation layer 130 may include organic material or inorganic material. The boots layer 120 may include a plurality of sections 122 separated from each other. The boots layer 120 includes organic material such as resin or Polyvinylpyrrolidone (PVP). The material of the conductive layer 140 includes transparent conductive material such as Indium tin oxide (ITO).

Figure 2A:
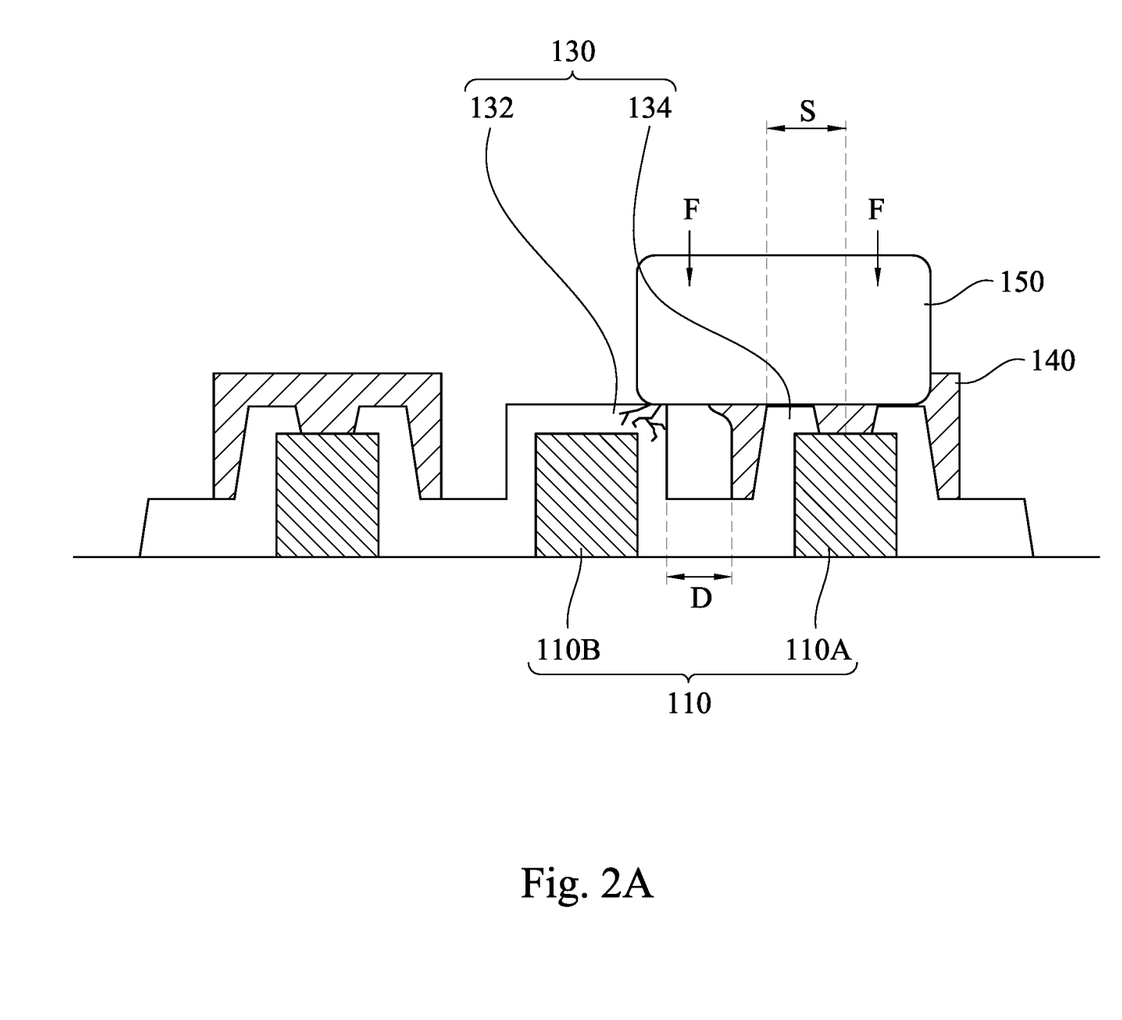
FIG. 2A is a cross-sectional view of a conventional display device.

FIG. 2A is a cross-sectional view of a conventional display device. The current product has fine-pitch design, and a precision deviation of a machine for positioning chips is about 5 um. Therefore, a situation that the distance D between the conductive layer 140 and the first portion 132 of the passivation layer 130 is smaller than the deviation of the machine may occur. For example, when a bump 150 of an electronic device (e.g., a chip) is positioned to connect the conductive layer 140 and the chip, a shift S between a center position of the bonding pad 110A and a center position of the bump 150 is defined as the positioning deviation. The positioning deviation of the machine may cause the bump 150 to be partially overlapped with the first portion 132 of the passivation layer 130 on the circuit 110B, and therefore the electronic element and the first portion 132 of the passivation layer 130 squeeze each other in the compression process. As a result, the passivation 130 may break and cause a short.

Figure 2B:
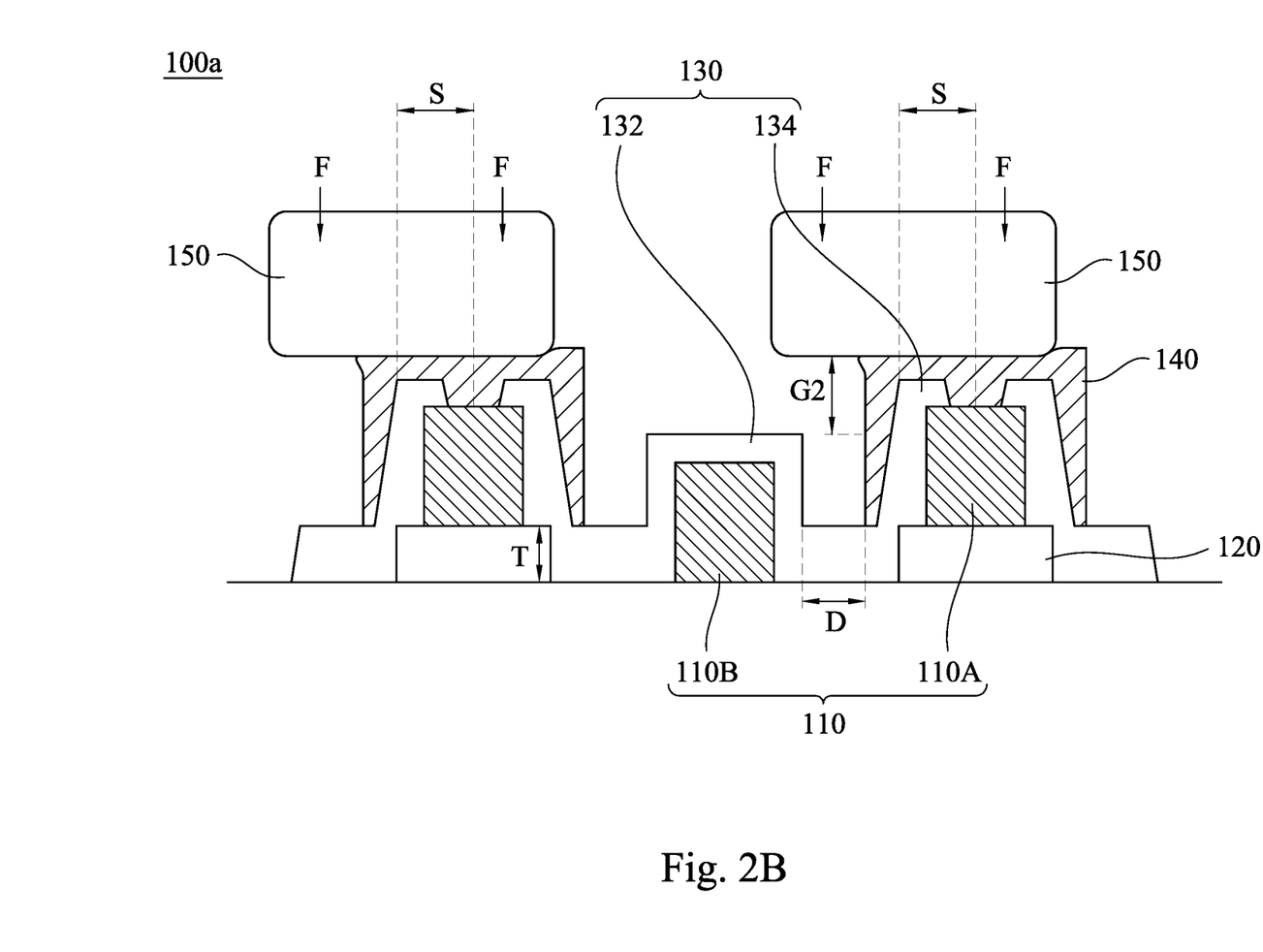
FIG. 2B is a cross-sectional view of another display device according to an embodiment of the present disclosure.

FIG. 2B is a cross-sectional view of another display device 100a according to an embodiment of the present disclosure. The display device 100a is a cross-sectional view of the display device 100 in FIG. 1 after connected with the bump 150. Reference is made to FIG. 1 and FIG. 2B. In this embodiment, the bump 150 of an electronic device (e.g., a chip) is connected with the conductive layer 140. The bump 150 and the first portion 132 of the passivation layer 130 still have a gap G2 therebetween after enduring an external force F in the compression and bonding processes, and the gap G2 is smaller than gap G1. It is noted by comparing FIG. 1 and FIG. 2A, the gap G1 between the top surface 140S of the conductive layer 140 and the top surface 132S of the first portion 132 of the passivation layer 130 can be increased by disposing the boots layer 120 below the bonding pad 110A. As such, as shown in FIG. 2B, the bump 150 and the first portion 132 of the passivation layer 130 still have the gap G2 therebetween after the bump 150 on the conductive layer 140 is compressed by the external force F, and therefore it can prevent the passivation layer 130 from being squeezed and broken.

Figure 2C:
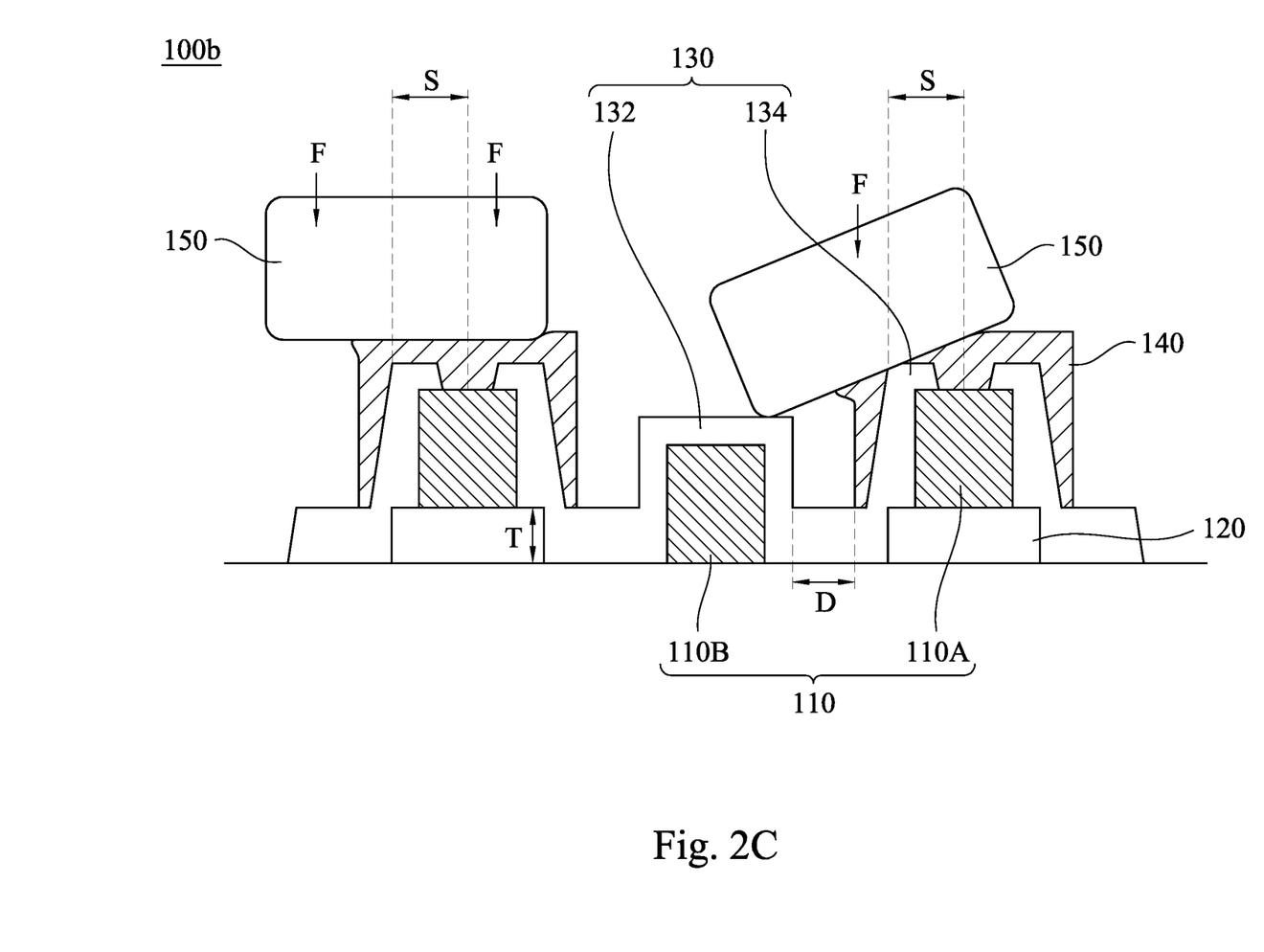
FIG. 2C is a cross-sectional view of another display device according to an embodiment of the present disclosure.

FIG. 2C is a cross-sectional view of another display device 100b according to an embodiment of the present disclosure. In the present embodiment, after the bump 150 on the conductive layer 140 is compressed by the external force F, the bump 150 is in contact with the first portion 132 of the passivation layer 130. However, since the gap G1 between the top surface 140S of the conductive layer 140 and the top surface 132S of the first portion 132 of the passivation layer 130 is increased due to boots layer 120, the pressure supplied by the bump 150 on the first portion 132 after bonding is not enough to break the passivation layer 130.

A thickness T of the boots layer 120 is smaller than 3 um. Such design may prevent increasing the volume of the display device 100 too much, and prevent the short in the display device. In addition, in the present embodiment, since the passivation layer 130 includes organic material which has better stretch ability, it can reduce the possibility of squeeze and breakage of the passivation layer 130.

Figure 3:
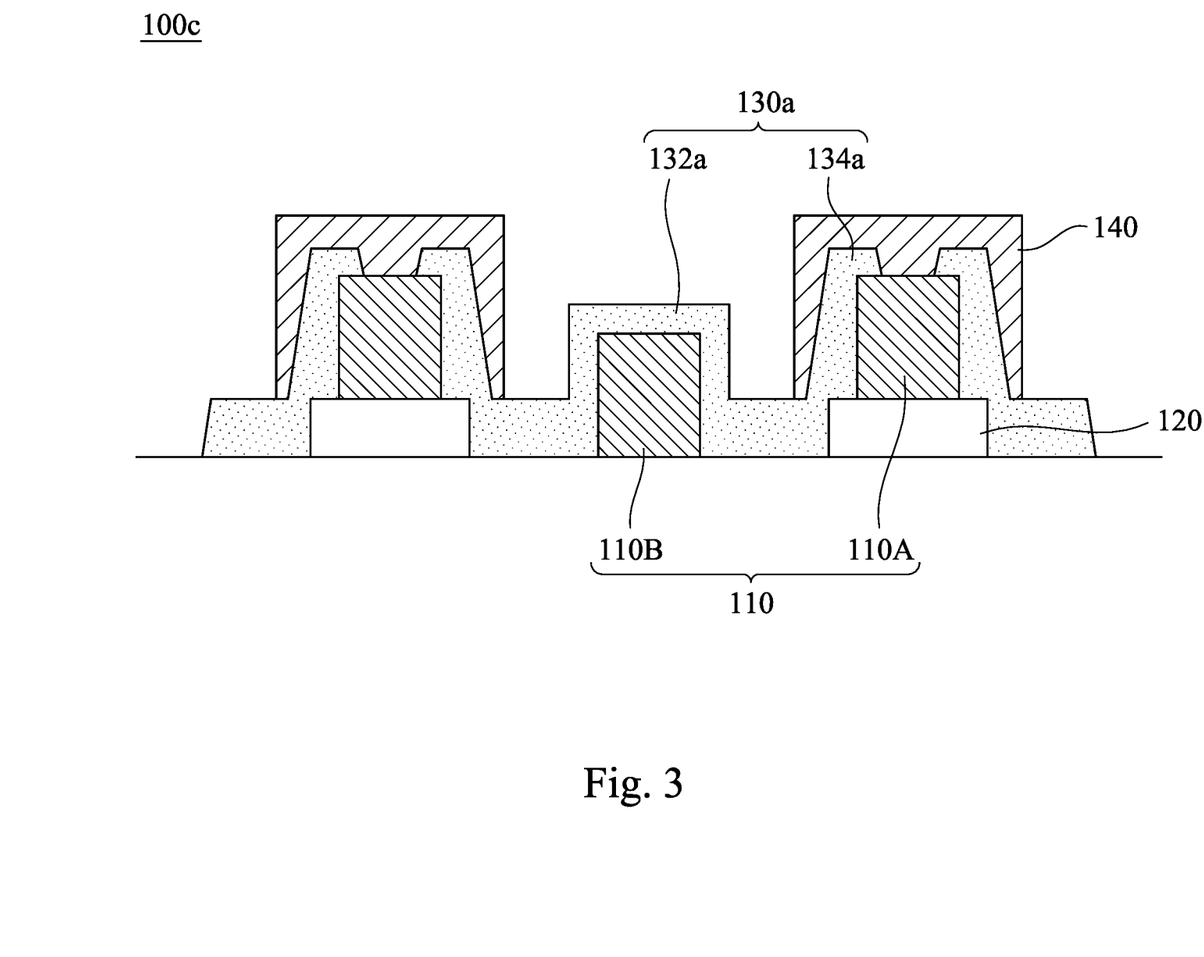
FIG. 3 is a cross-sectional view of a display device according to an embodiment of the present disclosure.

FIG. 3 is a cross-sectional view of a display device 100c according to an embodiment of the present disclosure. The display device 100c is substantially the same as the display device 100, and the difference is that the passivation layer 130a of the display device 100c includes both organic material and inorganic material. For example, the passivation layer 130a may include an inorganic material layer that is in contact with the metal layer 110 and an organic material layer covering the inorganic material layer (not shown). Therefore, the organic material layer of the passivation layer 130a may reduce the possibility of squeeze and breakage of the passivation layer 130a.

Figure 4:
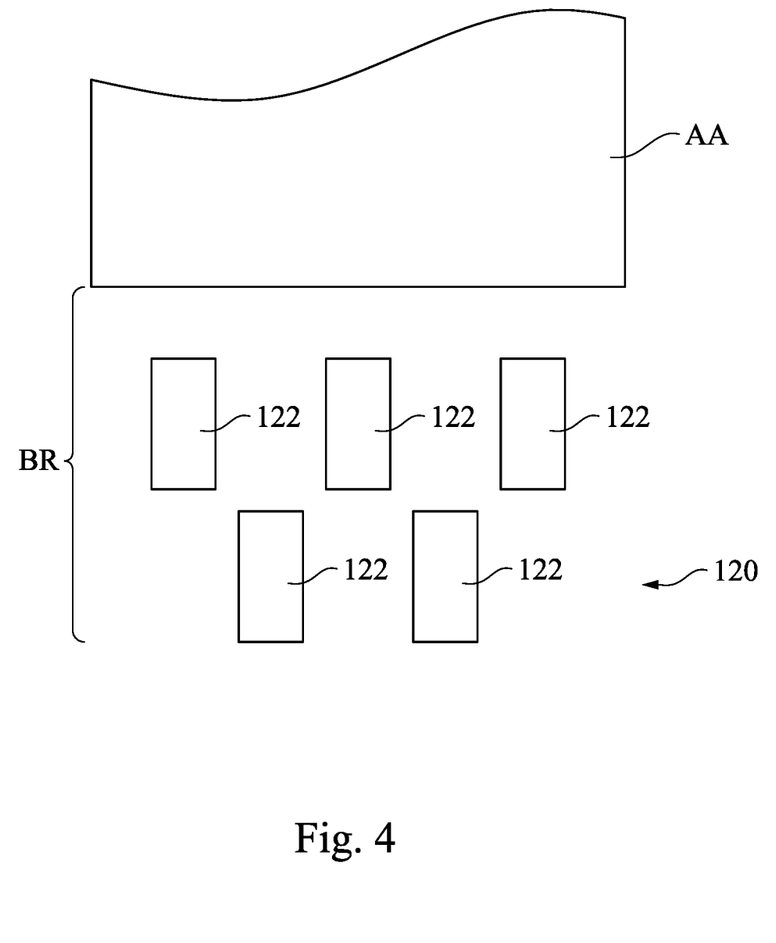
FIG. 4 is a top view of intermediate step of a fabrication method of a display device according to an embodiment of the present disclosure.
Figure 5:
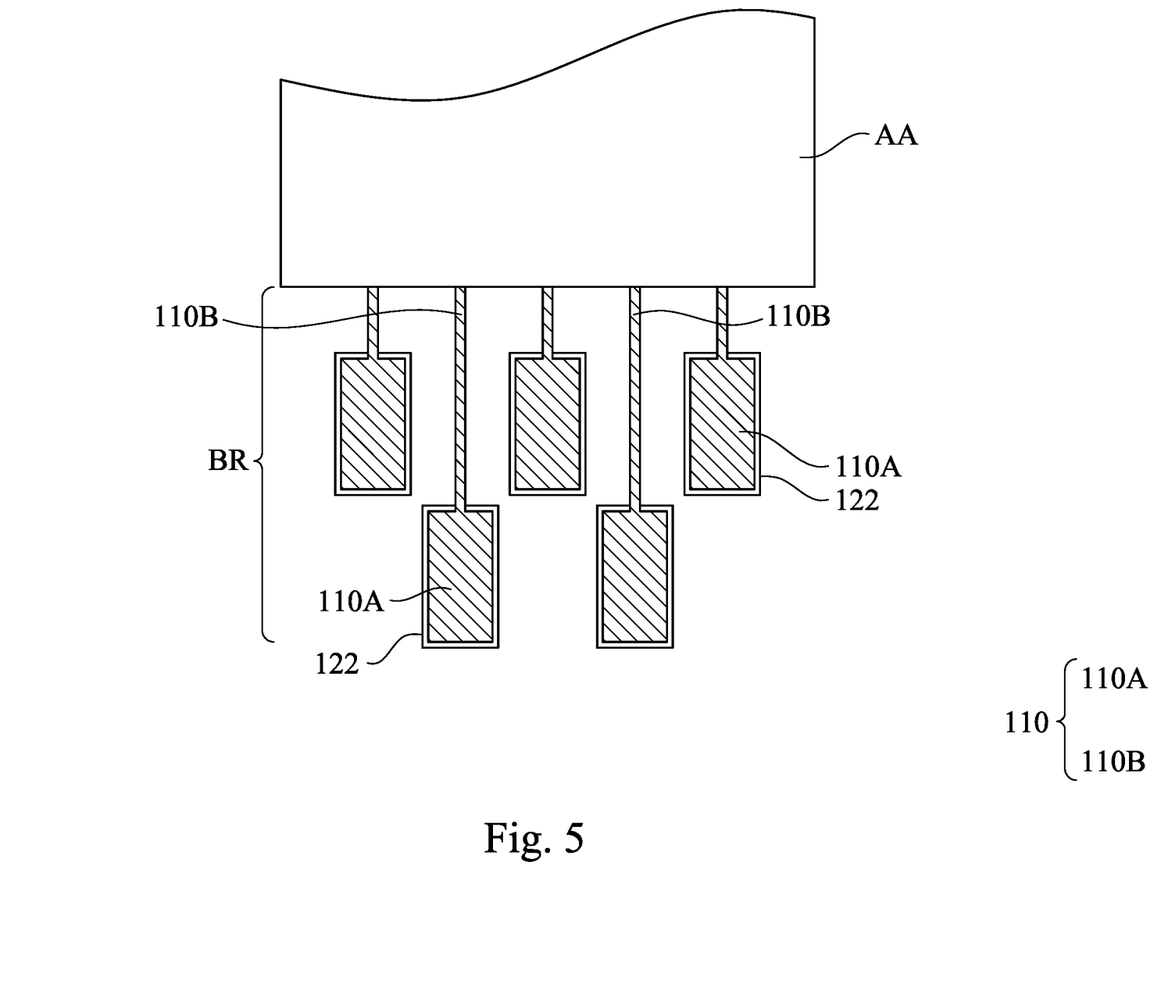
FIG. 5 is a top view of intermediate step of a fabrication method of a display device according to an embodiment of the present disclosure.
Figure 6:
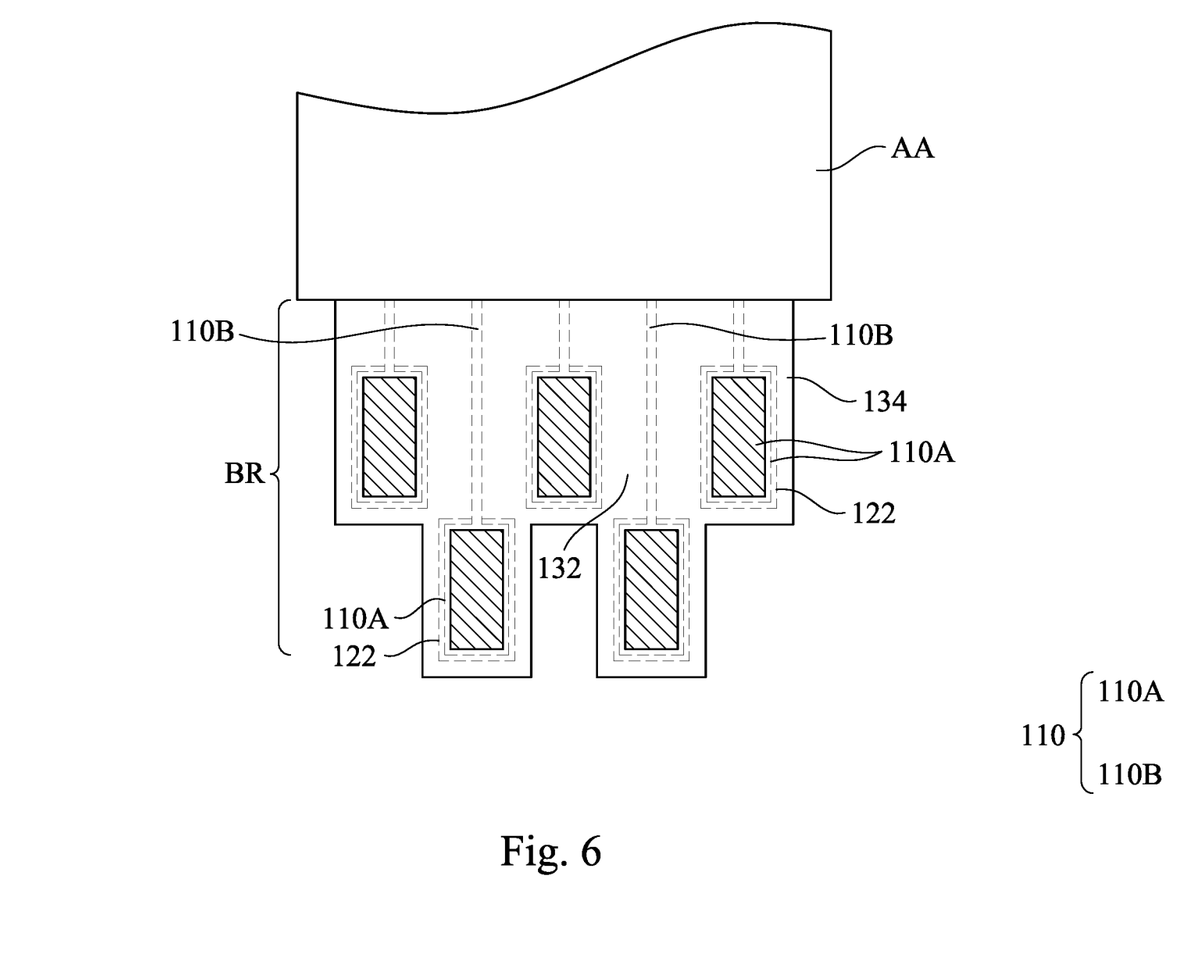
FIG. 6 is a top view of intermediate step of a fabrication method of a display device according to an embodiment of the present disclosure.

FIGS. 4 to 6 are top views of intermediate steps of a fabrication method of a display device according to an embodiment of the present disclosure. As shown in FIG. 4, the multiple sections 122 of the boots layer 120 are formed in the bonding region BR adjacent to the active region AA by a photolithography process. The sections 122 of the boots layer 120 are separated from each other and are arranged alternatively.

Subsequently, as shown in FIG. 5, the metal layer 110 is formed on the boots layer 120. The metal layer 110 includes a bonding pad 110A and a circuit 110B, and the bonding pad 110A of the metal layer 110 is overlapped with the boots layer 120. The circuit 110B is connected with the active region AA and the bonding pad 110A. In the present embodiment, the shape of the boots layer 120 when viewed from top is a rectangular shape, and the profile of the boots layer 120 when viewed from top is greater than the bonding pad 110A, but the present disclosure is not limited in this regard. In other embodiment, the boots layer 120 can has arbitrary shape and arbitrary size, such as elliptical shape, cylindrical shape, or irregular shape, as long as the gap G1 between the bump 150 and the first portion 132 of the passivation layer 130 can be increased.

Subsequently, as shown in FIG. 6, the passivation layer 130 is formed on the metal layer 110. The passivation layer 130 includes a first portion 132 covering the circuit 110B and a second portion 134 covering the bonding pad 110A. The second portion 134 of the passivation layer 130 is overlapped with the boots layer 120. Reference is made to FIG. 1 and FIG. 6, the step of forming the passivation layer 130 further includes exposing the bonding pad 110A of the metal layer 110 from the passivation layer 130 such that the metal layer 110 can be electrically connected with the conductive layer 140 in the subsequent process.

Finally, as shown in FIG. 7, the conductive layer 140 is formed on the passivation layer 130. Reference is made to FIG. 1 and FIG. 7, the conductive layer 140 covers the passivation layer 130 and the metal layer 110, and the conductive layer 140 is electrically connected with the bonding pad 110A of the metal layer 110. The conductive layer 140 is overlapped with the second portion 134 of the passivation layer 130, the bonding pad 110A, and the boots layer 120. As described above, after forming the conductive layer 140, the conductive layer 140 can be subsequently connected with the electronic element (e.g., the bump 150 shown in FIG. 2B) so as to be electrically connected with external electronic device.

In summary, the display device of the present disclosure has a boots layer below the metal layer, and therefore the distance between the top surface of the conductive layer and the passivation layer on the circuit of the metal layer is increased. Accordingly, the electronic element disposed on the bonding pad of the conductive layer and the passivation layer located on the circuit of the metal layer do not squeeze each other and being broken due to positioning deviation of the machine, thereby prevent the short. In addition, since the passivation layer includes organic material, it can reduce the possibility of squeeze and breakage of the passivation layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
a metal layer comprising a bonding pad and a circuit;
a boots layer disposed below the metal layer, the boots layer is partially overlapped with the metal layer, the boots layer is overlapped with the bonding pad along a direction of an orthogonal projection, and the boots layer is free from overlapping with the circuit along the direction of the orthogonal projection;
a passivation layer covering the metal layer and the boots layer, wherein the passivation layer comprises a first portion located on the circuit and a second portion located on the boots layer and the bonding pad along the direction of the orthogonal projection; and
a conductive layer covering the passivation layer and the metal layer, and the conductive layer and the boots layer are overlapped along the direction of the orthogonal projection, the second portion of the passivation layer is located between the boots layer and the conductive layer, and the conductive layer is free from overlapping with the circuit along the direction of the orthogonal projection; and,
the conductive layer and the first portion of the passivation layer have a distance therebetween, and the distance is smaller than or equals to 5 um.

2. The display device of claim 1, wherein the boots layer comprises a plurality of sections, and the sections are separated from each other.

3. The display device of claim 1, wherein the boots layer comprises organic material.

4. The display device of claim 1, wherein a thickness of the boots layer is smaller than 3 um.

5. The display device of claim 1, wherein the passivation layer comprises organic material.

6. The display device of claim 1, wherein the passivation layer comprises organic material and inorganic material.

7. A fabrication method of a display device, comprising:
forming a boots layer;
forming a metal layer on the boots layer, wherein the boots layer is partially overlapped with the metal layer, and the metal layer comprises a bonding pad and a circuit, the boots layer is overlapped with the bonding pad along a direction of an orthogonal projection, and the boots layer is free from overlapping with the circuit along the direction of the orthogonal projection;
forming a passivation layer covering the metal layer and the boots layer, wherein the passivation layer comprises a first portion located on the circuit and a second portion located on the boots layer and the bonding pad along the direction of the orthogonal projection; and
forming a conductive layer on the passivation layer, wherein the conductive layer covers the passivation layer and the metal layer, and the conductive layer and the boots layer are overlapped along the direction of the orthogonal projection; wherein,
the conductive layer and the first portion of the passivation layer have a distance therebetween, and the distance is smaller than or equals to 5 um, the second portion of the passivation layer is located between the boots layer and the conductive layer, and the conductive layer is free from overlapping with the circuit along the direction of the orthogonal projection.

8. The fabrication method of claim 7, wherein forming the boots layer comprises forming a plurality of sections, and the sections are separated from each other.

9. The fabrication method of claim 7, further comprising connecting an electronic connection element with the conductive layer, wherein the electronic connection element is separated from the first portion of the passivation layer.

* * * * *